(12) United States Patent
Nakagawa et al.

(10) Patent No.: US 8,243,467 B2
(45) Date of Patent: Aug. 14, 2012

(54) SEMICONDUCTOR DEVICE

(75) Inventors: Yoshihiro Nakagawa, Tokyo (JP);
Masayuki Mizuno, Tokyo (JP)

(73) Assignee: NEC Corporation, Tokyo (JP)

(*) Notice: Subject to any disclaimer, the term of this patent is extended or adjusted under 35 U.S.C. 154(b) by 435 days.

(21) Appl. No.: 12/526,992

(22) PCT Filed: Feb. 5, 2008

(86) PCT No.: PCT/JP2008/051810
§ 371 (c)(1),
(2), (4) Date: Aug. 13, 2009

(87) PCT Pub. No.: WO2008/099711
PCT Pub. Date: Aug. 21, 2008

(65) Prior Publication Data
US 2010/0033239 A1     Feb. 11, 2010

(30) Foreign Application Priority Data
Feb. 13, 2007  (JP) ................. 2007-032255

(51) Int. Cl.
*H05K 7/00* (2006.01)
(52) U.S. Cl. ......... 361/783; 361/760; 361/729; 361/735
(58) Field of Classification Search ............... 361/609.1, 361/728, 729, 335, 736, 760, 783, 790, 679.01, 361/735; 257/686, 777
See application file for complete search history.

(56) References Cited

U.S. PATENT DOCUMENTS

| | | | | |
|---|---|---|---|---|
| 7,561,390 B2* | 7/2009 | Furuta | | 361/56 |
| 7,952,184 B2* | 5/2011 | Farrar et al. | | 257/687 |
| 2003/0085461 A1* | 5/2003 | Sakiyama et al. | | 257/700 |
| 2006/0001176 A1* | 1/2006 | Fukaishi et al. | | 257/777 |
| 2006/0017147 A1* | 1/2006 | Drost et al. | | 257/686 |
| 2006/0087013 A1* | 4/2006 | Hsieh | | 257/678 |
| 2007/0043894 A1* | 2/2007 | Zingher et al. | | 710/310 |
| 2007/0262465 A1* | 11/2007 | Iwabuchi | | 257/777 |
| 2008/0230888 A1* | 9/2008 | Sasaki | | 257/686 |
| 2009/0233546 A1* | 9/2009 | Sasaki et al. | | 455/41.1 |

FOREIGN PATENT DOCUMENTS

| | | |
|---|---|---|
| JP | 61-073359 A | 4/1986 |
| JP | 62-241365 A | 10/1987 |
| JP | 4-305960 A | 10/1992 |
| JP | 2005228981 A | 8/2005 |
| JP | 2006266702 A | 10/2006 |

OTHER PUBLICATIONS

International Search Report for PCT/JP2008/051810 mailed May 1, 2008.

* cited by examiner

*Primary Examiner* — Hoa C Nguyen

(57) ABSTRACT

A main chip has a signal processing circuit for executing signal processing; a plurality of signal transmitting circuits for transmitting signals between the signal processing circuit and a signal transmitting circuit; and a control circuit for controlling operation/non-operation of the signal transmitting circuits in accordance with signal processing content of the signal processing circuit. Functional chips each have a signal processing circuit for executing auxiliary signal processing different from that of the signal processing circuit; and one or a plurality of signal transmitting circuits for transmitting signals between the signal processing circuit and the signal transmitting circuits. The main chip and the functional chips are stacked. The signal transmitting circuits and the signal transmitting circuit are non-contact-type signal transmitting circuits utilizing inductive coupling and are arranged so as to overlap when viewed from the stacking direction.

7 Claims, 4 Drawing Sheets

(FIRST EXEMPLARY EMBODIMENT)
X—X'

FIG.1 (FIRST EXEMPLARY EMBODIMENT)
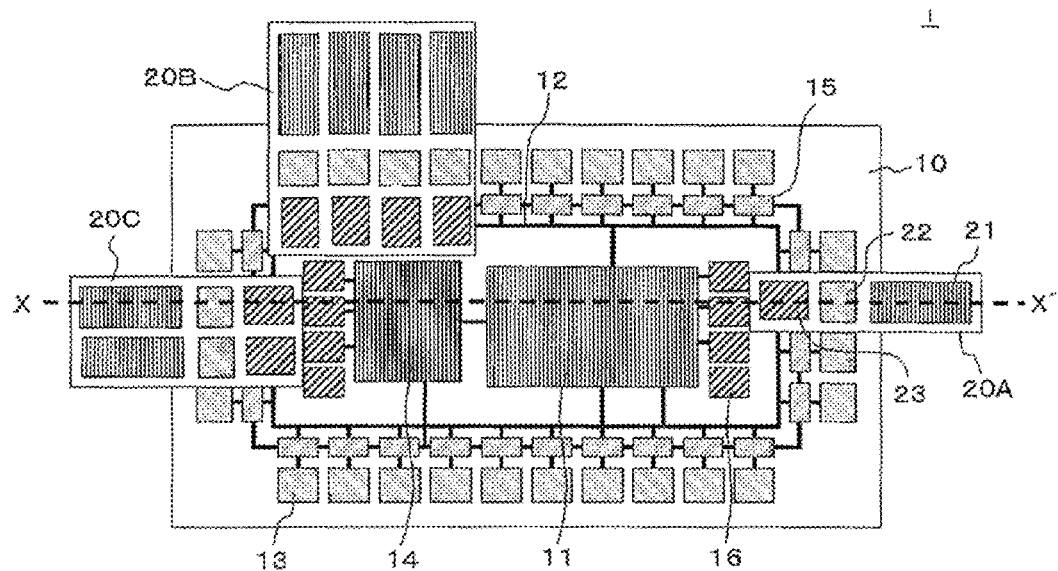
FIG.2 (FIRST EXEMPLARY EMBODIMENT)
X–X'
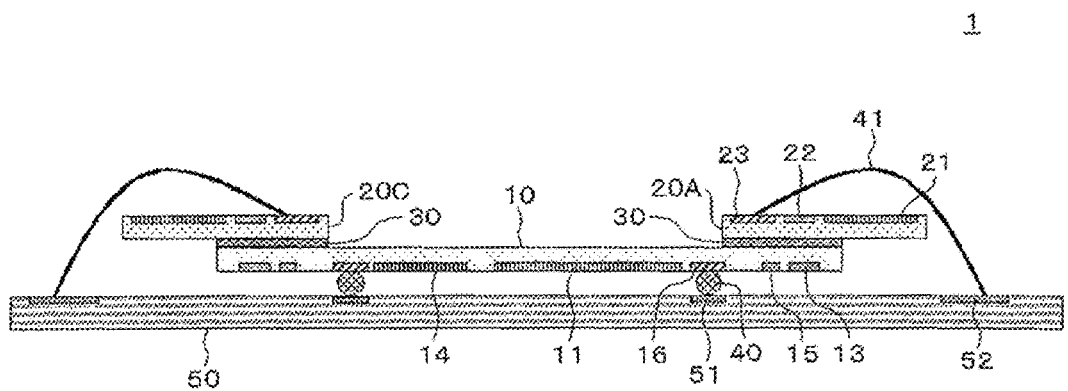

FIG.3 (FIRST EXEMPLARY EMBODIMENT)
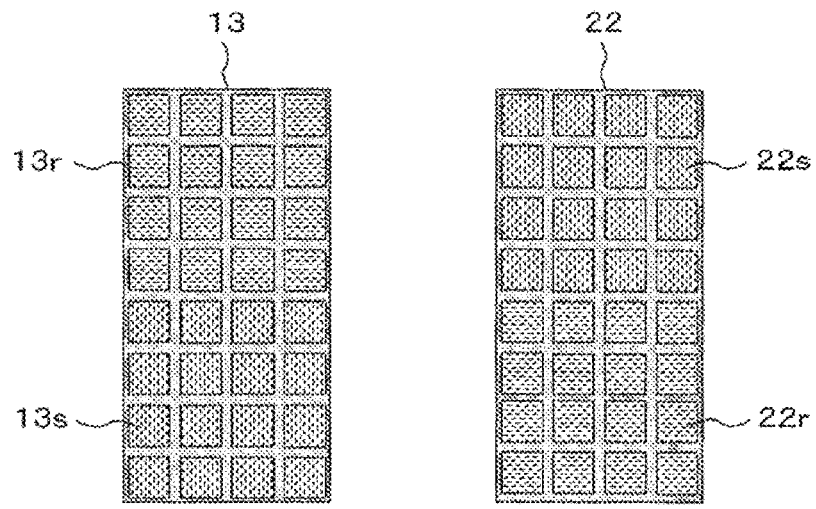
FIG.4 (FIRST EXEMPLARY EMBODIMENT)
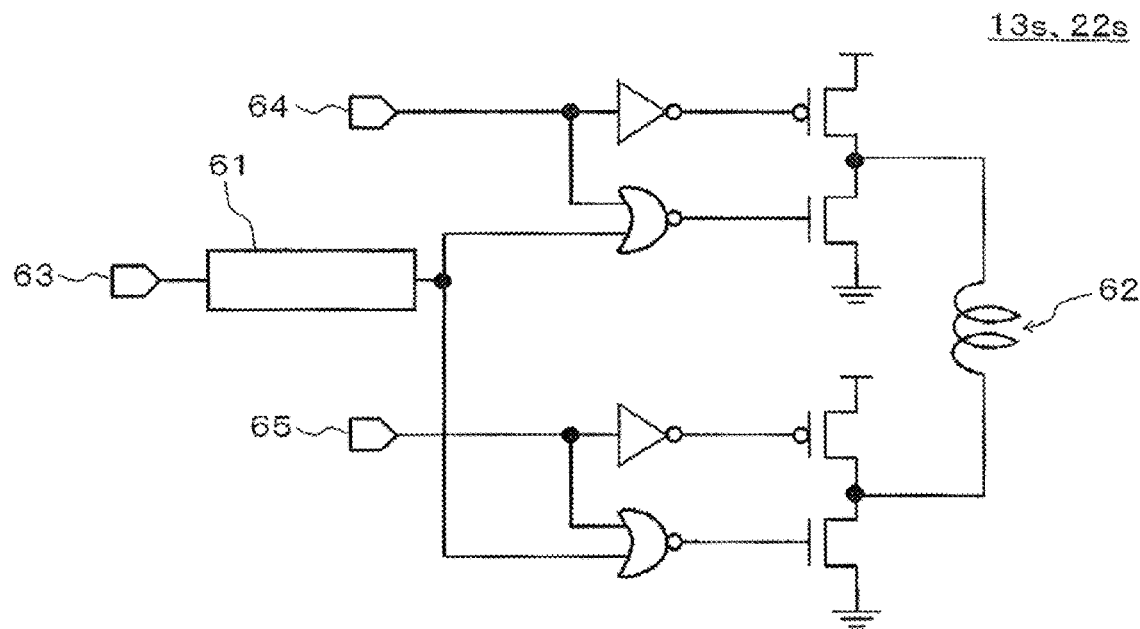

FIG.5 (FIRST EXEMPLARY EMBODIMENT)
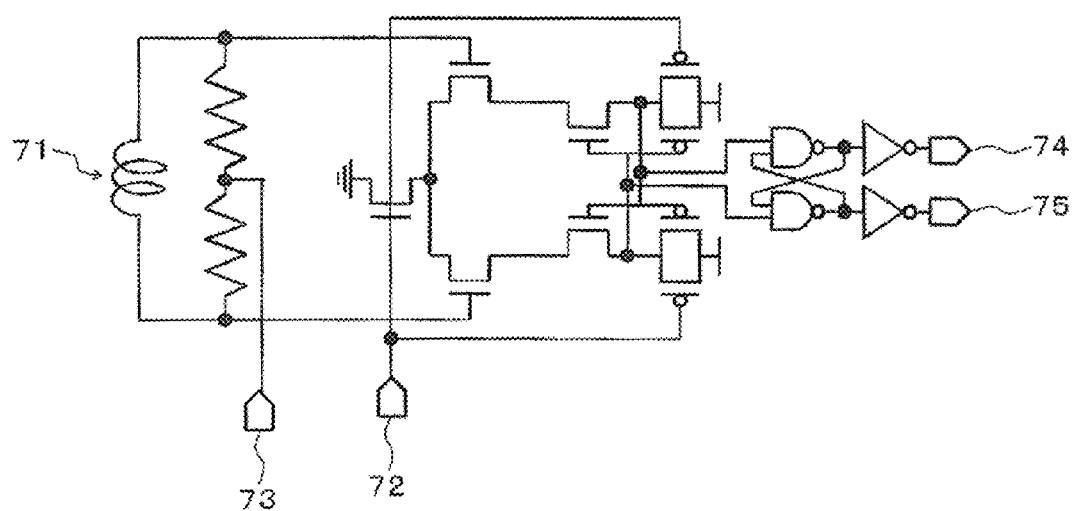
FIG.6 (FIRST EXEMPLARY EMBODIMENT)
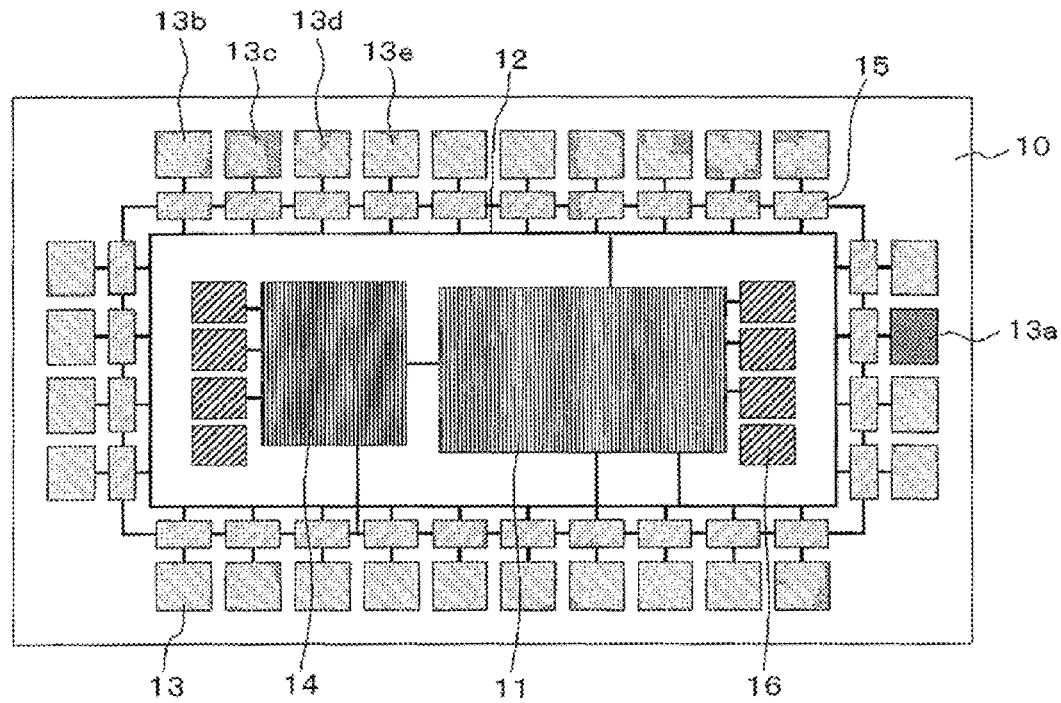

FIG.7 (FIRST EXEMPLARY EMBODIMENT)
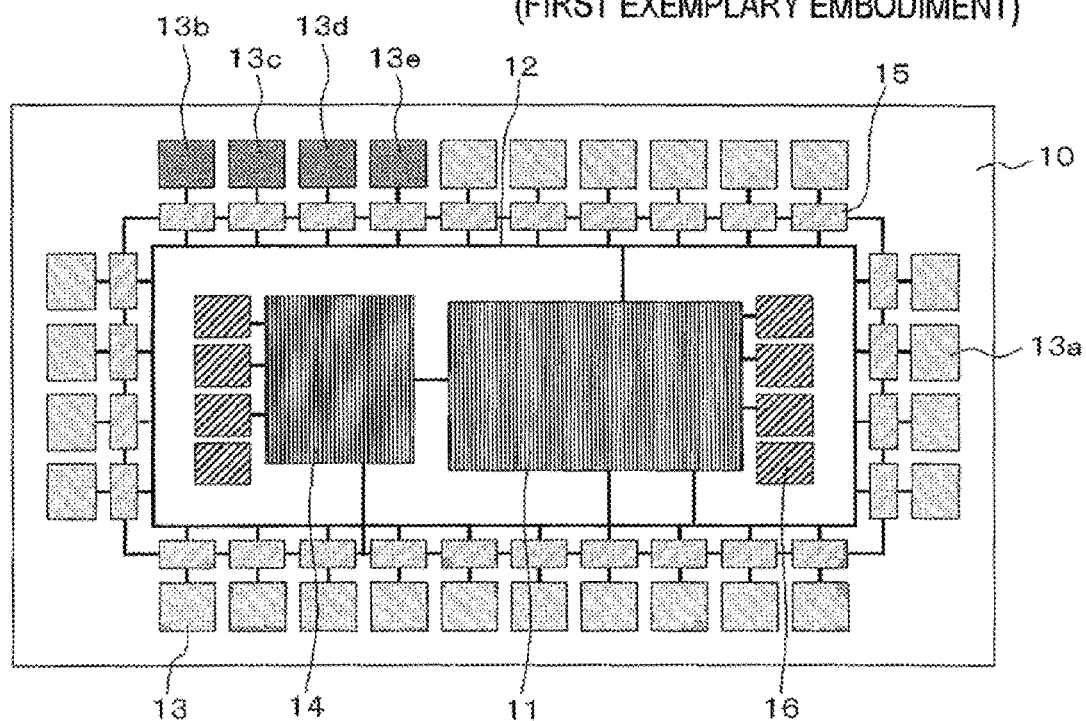
FIG.8 (COMPARISON EXAMPLE)
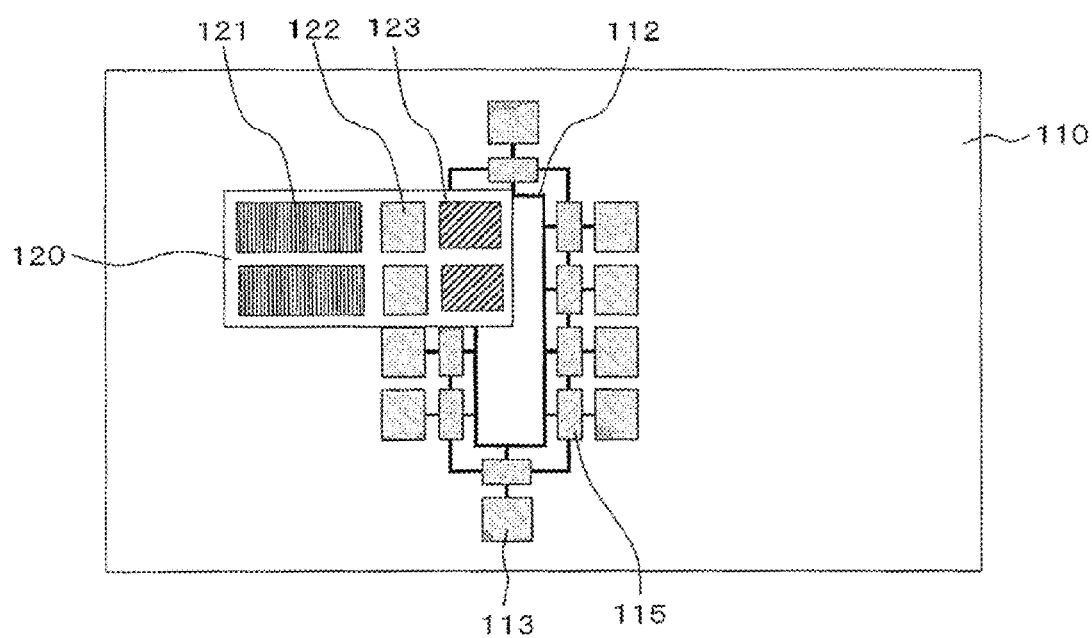

SEMICONDUCTOR DEVICE

This application is the National Phase of PCT/JP2008/051810, filed Feb. 5, 2008, which is based upon and claims priority from Japanese Patent Application No. 2007-032255 (filed on Feb. 13, 2007), which is hereby incorporated by reference herein in its entirety.

TECHNICAL FIELD

This invention relates to a semiconductor device obtained by combining a plurality of semiconductor chips. More particularly, the invention relates to a semiconductor device in which it is possible to combine a plurality of functions.

BACKGROUND ART

Microfabrication of semiconductor chips has become possible with the advances that have been made in semiconductor manufacturing techniques, and SoC (System-on-a-Chip) capable of advanced signal processing has been achieved by mounting analog and digital circuits, interface functions for interfacing various devices and various other functions on one and the same chip.

By way of example, an LSI chip used in a mobile telephone can be mentioned. In an LSI chip intended for a mobile telephone, there are instances where a functional block for controlling wireless communication and a functional block for implementing various applications incorporated in a mobile telephone are mounted on a single chip. In addition to these functional blocks, various functional blocks such as a block for interfacing an external memory device, a functional block for controlling a camera unit and an LCD driver, etc., are mounted on the chip in conformity with customer demand.

By thus mounting a plurality of functional blocks on the same chip, it is possible to reduce occupied area and lower the cost of system manufacture in comparison with the conventional system composed of a plurality of individual chips equipped with the respective functions.

[Patent Document 1] Japanese Patent Kokai Publication No. 62-241365A

[Patent Document 2] Japanese Patent Kokai Publication No. 4-305960

SUMMARY

The analysis set forth below is offered by the inventor.

It should be noted that the contents disclosed in Patent Documents 1 and 2 cited above are hereby incorporated by reference herein in their entirety.

A disadvantage of an SoC is that a limitation is imposed upon the functions thereof at the time of manufacture. In a case where use of an SoC differs, an entire re-design becomes necessary for every SoC use and, at the same time, the mask set needed for chip manufacture must be re-fabricated. As a consequence, design cost, mask-set manufacturing expense and chip manufacturing cost rise.

A further problem with an SoC is that since each functional block is manufactured on the same chip, a manufacturing process that is ideal for every chip cannot be utilized. This invites a decline in performance and an increase in manufacturing cost.

Further, in a case where the supply voltage for every functional block of the SoC differs, it is required that the power supplies between blocks be isolated. Owing to isolation of the power supplies, the area of the chip occupied increases and this results in a further increase in manufacturing cost.

Technology whereby the problem involving the need to perform chip re-design for every SoC use is avoided by mounting functional blocks redundantly has been disclosed (for example, see Patent Documents 1 and 2). Specifically, functional blocks whose uses are predicted are designed beforehand in a state in which they have been mounted oil the chip, and only the necessary functional blocks among these functional blocks are activated, using selectors or fuses, in conformity with the uses thereof, thereby meeting the particular requirements. If such an arrangement is adopted, it is possible to satisfy customer needs without redesigning the chip as far as the predicted functional blocks are concerned.

However, in a case where a function other than those of the predicted functional blocks is required, chip re-design becomes necessary because the required functional block has not been mounted on the chip. In addition, since the chip is equipped with redundant functional blocks that do not perform circuit operations, the aforementioned problem of an increase in chip area becomes even more acute and this leads to an increase in cost of manufacture. Similarly, the problem of isolating the power supplies between functional blocks cannot be solved.

It is a main objective of the present invention to minimize the necessary number of functional blocks mounted and to reduce chip area, thereby lowering the cost of manufacture.

In one aspect of the present invention, a semiconductor device obtained by combining a plurality of semiconductor chips is characterized by comprising: a first semiconductor chip having: a first signal processing circuit that executes signal processing, a plurality of first signal transmitting circuits that transmit signals between the first signal processing circuit and the exterior, and a control circuit that controls operation/non-operation of the first signal transmitting circuits in accordance with content of signal processing by the first signal processing circuit; and a second semiconductor chip having a second signal processing circuit that executes signal processing different from that of the first signal processing circuit, and one or a plurality of second signal transmitting circuits that transmit signals between the second signal processing circuit and the first signal processing circuit.

In the semiconductor device of the present invention, preferably the first semiconductor chip has selecting circuits that select operation/non-operation of the first signal transmitting circuits in response to control by the control circuit.

In the semiconductor device of the present invention, preferably the first signal processing circuit is connected to each of the first signal transmitting circuits via a common signal line group.

In the semiconductor device of the present invention, preferably the first signal processing circuit is connected to each of the selecting circuits via a common signal line group.

In the semiconductor device of the present invention, preferably the first semiconductor chip and the second semiconductor chip are stacked, the first signal transmitting circuits and the second signal transmitting circuits are arranged so as to overlap when viewed from the stacking direction; and the first signal transmitting circuits and the second signal transmitting circuits are non-contact-type signal transmitting circuits utilizing inductive coupling.

In the semiconductor device of the present invention, preferably signal transmission paths between the first since transmitting circuits and the second signal transmitting circuits include any one or a plurality of bonding wires, solder bumps, capacitive coupling and via holes.

In the semiconductor device of the present invention, preferably the first signal transmitting circuits are arranged in a peripheral region of the first semiconductor chip.

In the semiconductor device of the present invention, preferably circuits within the first semiconductor chip are configured so as to be combinable with circuits within the second semiconductor chip irrespective of type of function of the second semiconductor chip.

In the semiconductor device of the present invention, preferably the first and second semiconductor chips are manufactured in advance before function and use of the device are decided.

The effects set forth below are attained in accordance with the present invention. Specifically, circuits requiring to be designed or manufactured anew are made the minimum necessary and it is possible to lower chip cost. In other words, since it is possible to design and manufacture a general-purpose functional chip beforehand, chips that include circuits that must be designed and manufactured anew are held to the minimum necessary. This makes it possible to lower the cost required for chip design, manufacture and inspection. Further, since the chip area of individual chips manufactured is reduced, manufacturing yield is improved and it is possible to lower chip manufacturing cost. Furthermore, since it is possible to select the manufacturing process that is optimum for each chip, the cost of manufacture can be reduced. In addition, since a change in the functions of the semiconductor device can be dealt with merely by adding on or changing functional chips, the change in function can be realized with facility.

BRIEF DESCRIPTION OF THE DRAWINGS

FIG. 1 is a top plan view (block diagram) schematically illustrating the configuration of a semiconductor device according to a first embodiment of the present invention;

FIG. 2 is a sectional view taken along line X-X' of FIG. 1 and schematically illustrating the arrangement in a state in which the semiconductor device is mounted on a wiring board according to the first embodiment of the present invention;

FIG. 3 is a schematic view illustrating the relationship between a signal transmitting circuit in a main chip and a signal transmitting circuit in a functional chip in the semiconductor device according to the first embodiment of the present invention;

FIG. 4 is a circuit diagram illustrating an example of the circuit arrangement of a transmit circuit in signal transmitting circuits of the main chip and functional chip in the semiconductor device according to the first, embodiment of the present invention;

FIG. 5 is a circuit diagram illustrating an example of the circuit arrangement of a receive circuit in signal transmitting circuits of the main chip and functional chip in the semiconductor device according to the first embodiment of the present invention;

FIG. 6 is a top plan view (block diagram) schematically illustrating a first state of signal transmitting circuits in the main chip of the semiconductor device according to the first embodiment of the present invention;

FIG. 7 is a top plan view (block diagram) schematically illustrating a second state of signal transmitting circuits in the main chip of the semiconductor device according to the first embodiment of the present invention; and FIG. 8 is a top plan view (block diagram) schematically illustrating the configuration of a semiconductor device according to an example for comparison purposes.

DESCRIPTION OF REFERENCE CHARACTERS 1 semiconductor device
10, 110 main chip (first semiconductor chip)
11 signal processing circuit
12, 112 signal line
13, 13a, 13b, 13c, 13d, 13e, 113 signal transmitting circuit
13s transmit circuit
13r receive circuit
15, 115 selecting circuit
16 pad
20, 20A, 20B, 20C, 20D functional chip (second semiconductor chip)
21, 121 signal processing circuit
22, 122 signal transmitting circuit
22s transmit circuit
22r receive circuit
23, 123 pad
30 adhered portion
40 solder ball
41 bonding wire
50 wiring board
51 pad
52 pad
61 micropulse generating circuit
62 transmitting inductor
63 clock signal
64 transmit data
65 inverted transmit data
71 receiving inductor
72 clock signal
73 control signal
74 receive data
75 inverted receive data

PREFERRED MODES (First Embodiment)

A semiconductor device according to a first embodiment of the present invention will be described with reference to the drawings. FIG. 1 is a top plan view (block diagram) schematically illustrating the configuration of a semiconductor device according to a first embodiment of the present invention. FIG. 2 is a sectional view taken along line X-X' of FIG. 1 and schematically illustrating the arrangement in a state in which the semiconductor device is mounted on a wiring board according to the first embodiment of the present invention. FIG. 3 is a schematic view illustrating the relationship between a signal transmitting circuit in a main chip and a signal transmitting circuit in a functional chip in the semiconductor device according to the first embodiment of the present invention. It should be noted that a signal line 12 is not shown in FIG. 2.

A semiconductor device 1 is obtained by combining semiconductor chips that execute different signal processings. In FIG. 1, the semiconductor device 1 has a main chip 10 as a semiconductor chip and functional chips 20A to 20C. The arrangement of the semiconductor device 1 is such that the main chip 10 and functional chips 20A to 20C are bonded together back to back (the back side is that opposite the pad side). The functional chips 20A to 20C are arranged so as to protrude beyond the edge of the main chip 10.

The main chip 10 is a semiconductor chip for executing the signal processing of the main function in an electronic device equipped with the semiconductor device 1. The main chip 10 is surface-mounted on a wiring board 50, inputs and outputs signals from and to the exterior of the chip and receives a supply of electric power at the same time via solder balls 40. The main chip 10 has a signal processing circuit 11, a signal line 12, signal transmitting circuits 13, a control circuit 14, selecting circuits 15 and pads 16.

It should be noted that although the solder balls 40 serve as the means for inputting and outputting signals and for transmitting the supply of power, the invention is not limited to this arrangement. It is also possible to transmit signals by transmission means utilizing inductive coupling, transmission means utilizing capacitive coupling, transmission means using via holes that form transmission paths through the chip, transmission means using a micropump, transmission means using a wire bond, or any combination of these transmission means.

The signal processing circuit 11, one or more of which is provided, is a circuit for executing the signal processing of the main function together with a signal processing circuit(s) 21 of the auxiliary functional chips 20 (20A to 20C). The signal processing circuit 11 is connected to each of the signal transmitting circuits 13 and to each of the selecting circuits 15 via the common signal line 12 (common bus). By using the common bus for the connection between the signal processing circuit 11 and each signal transmitting circuit 13 and each selecting circuit 15, the degree of freedom regarding the placement position of each signal transmitting circuit 13 is raised and it is possible to deal with the placement positions and functions of various functional chips 20. The signal line 12 is wiring that transmits signals between prescribed circuits. The signal transmitting circuits 13, a plurality of which are provided, are circuits for transmitting (sending and receiving) signals to the corresponding signal transmitting circuits 22 of the functional chips 20A to 20C. The signal transmitting circuits 13 are changed over between operation and non-operation by selection performed by the corresponding selecting circuits 15. The signal transmitting circuits 13 are designed in conformity with the amount of data transmitted to and from the signal transmitting circuits 22 of the functional chips 20. The details of the signal transmitting circuits 13 will be described later. The control circuit 14 is a circuit for controlling the selecting circuits 15 and signal line 12 in accordance with the signal processing content of the signal processing circuit 11. The control circuit 14 controls operation/non-operation of the signal transmitting circuits 13 indirectly. The selecting circuits 15 are circuits that select operation/non-operation of the corresponding signal transmitting circuits 13 by being controlled by the corresponding control circuit 14. Pads 16 are electrodes for being electrically connected to pads 51 of the wiring board 50.

The functional chips 20 (20A to 20C) are semiconductor chips that implement auxiliary functions of the signal processing circuit 11 of main chip 10. Examples of the functional chips 20 that can be mentioned are semiconductor chips having only a single function, such as that of an interface with an external apparatus, a functional block for controlling a camera unit, an LCD driver or a memory device. The functional chips 20 receive signal input/outputs and supply of power by the bonding wire 41. The functional chips 20 have the signal processing circuit 21, the signal transmitting circuit 22 and a pad 23. The functional chip 20A has one set of the signal processing circuit 21, signal transmitting circuit 22 and pad 23 in combination, the functional chip 20B has two sets of the signal processing circuit 21, signal transmitting circuit 22 and pad 23 in combination, and the functional chip 20C has four sets of the signal processing circuit 21, signal transmitting circuit 22 and pad 23 in combination.

Although the bonding wire 41 is used in the functional chips 20 as the means for transmitting signal input/output and supply of power, the invention is not limited to this arrangement. It is also possible to transmit signals by transmission means utilizing inductive coupling, transmission means utilizing capacitive coupling, transmission means using via holes that form transmission paths through the chip, transmission means using a micropump, transmission means using solder balls, or any combination of these transmission means.

The signal processing circuit 21 is a circuit for executing signal processing (signal processing different from that of the signal processing circuit 11) of an auxiliary function together with the signal processing circuit 11 of tile main chip 10. The signal transmitting circuit 22 is a circuit for transmitting (sending and receiving) signals to the corresponding signal transmitting circuit 13 of the main chip 10. One or a plurality of the signal transmitting circuits 22 are provided, with the number thereof being less than that of the signal transmitting circuits 13 of the main chip 10. The signal transmitting circuit 22 is designed in conformity with the amount of data transmitted to and from the signal transmitting circuits 13 of the main chip 10. The details of the signal transmitting circuit 22 will be described later. The pad 23 is an electrode for making an electrical connection to the pad 52 of the wiring board 50 via the bonding wire 41.

The main chip 10 and functional chips 20 are packaged in such a manner that the signal transmitting circuits 13 in the main chip 10 and the signal transmitting circuits 22 in the functional chips 20 exactly overlap in the stacking direction of the chips, and signals are transmitted between the signal transmitting circuits 13 and signal transmitting circuits 22 utilizing non-contact signal transmission that employs inductive coupling (see FIG. 2). If the positions and number of transmit circuits and receive circuits among the signal transmitting circuits and signal transmitting circuits 22 are decided in standard fashion beforehand, signal transmission between the chips will be possible using the standardized signal transmitting circuits 13 even with respect to various functional chips 20.

The signal transmitting circuits 13 of the main chip 10 have transmit circuits 13s and receive circuits 13r, and the signal transmitting circuits of the functional chips 20 also have transmit circuits 22s and receive circuits 22r (see FIG. 3). Viewed from the stacking direction of the chips, the receive circuits 22r are above the transmit circuits 13s, and the transmit circuits 22s are above the receive circuits 13r. That is, the placement of the transmit circuits 13s and receive circuits 13r of the signal transmitting circuit 13 is opposite the placement of the transmit circuits 22s and receive circuits 22r of the signal transmitting circuit 22, and the respective transmit circuits and receive circuits overlap when in the stacked state.

An example of the transmit circuits 13s, 22s is shown in FIG. 4, and an example of the receive circuits 13r, 22r is shown in FIG. 5. With non-contact signal transmission utilizing inductive capacitance, current that is dependent upon a micropulse generated by a micropulse generating circuit 61 based upon a clock signal 63, transmit data 64 and inverted transmit data 65 flows into a transmit inductor 62. By observing the induced current generated in a receive inductor 71 by electromagnetic induction, a signal transmission is performed as receive data 74 and receive-inverted data 75 obtained by signal restoration by a clock signal 72 and control signal 73.

Next, mounting positions of the signal line and signal transmitting circuits of the main chip 10 in the semiconductor device according to the first embodiment of the present invention will be described with reference to the drawings while making a contrast with an example for comparison purposes. FIG. 8 is a top plan view (block diagram) schematically illustrating the configuration of a semiconductor device according to an example for comparison purposes.

In a semiconductor device, it is preferred that mounting of as many functional chips as feasible be possible in order to raise the degree of freedom of design. To achieve this, mounting the signal transmitting circuits in the peripheral regions of the main chip is effective. For example, in a case where signal transmitting circuits 113 have been mounted at the central portion of a main chip 110, as shown in FIG. 8, a functional chip 120 interferes with other functional chips (not shown), it is difficult to mount a plurality of functional chips and the number of functional chips that can be mounted is limited. On the other hand, if signal transmitting circuits 13 are arranged in a peripheral region of the main chip 10, as shown in FIG. 1, it is possible to mount a greater number of functional chips 20. Arranging the signal transmitting circuits 13 along the periphery of the main chip 10, therefore, is best.

Next, operation of the semiconductor device according to the first embodiment of the present invention will be described with reference to the drawings. FIG. 6 is a top plan view (block diagram) schematically illustrating a first state of signal transmitting circuits in the main chip of the semiconductor device according to the first embodiment of the present invention, and FIG. 7 is a top plan view (block diagram) schematically illustrating a second state of signal transmitting circuits in the main chip of the semiconductor device according to the first embodiment of the present invention.

In a case where the signal processing circuit 11 of main chip 10 exchanges signals with the functional chip 20A (see FIG. 1), the selecting circuits 15 and signal line 12 are controlled by the control circuit 14 in such a manner that a signal transmitting circuit 13a corresponding to the functional chip 20A operates, as shown in FIG. 6. Signal transmitting circuits 13b to 13d other than the signal transmitting circuit 13a are controlled so as not to operate at this time. Further, when the main chip 10 exchanges signals with the functional chip 20B rather than with the functional chip 20A (see FIG. 1), the selecting circuits 15 and signal line 12 are controlled by the control circuit 14 so as to halt operation of the signal transmitting circuit 13a corresponding to the functional chip 20A and operate the signal transmitting circuits 13b to 13e corresponding to the functional chip 20B, as shown in FIG. 7, thereby connecting the main chip 10 with the functional chip 20B. By thus controlling the signal line 12 and selecting circuits 15 using the control circuit 14, the signal processing circuit 11 is capable of exchanging signals with the plurality of functional chips 20A to 20C.

A method of manufacturing the semiconductor device according to the first embodiment of the present invention will be described next.

Unlike an ordinary SoC, the design of the functional chips and the manufacture of a mask set are completed before the functions and specifications of the signal processing circuits are decided (see FIG. 1). Here, not only the map set, but the manufacture of the chips may be completed.

Next, after the functions and specifications of the semiconductor device 1 have been decided, the required functional chips 20A to 20C are selected from the main chip 10 and the functional chips manufactured in advance (see FIG. 1). Preformed at this time are design of the main chip 10 and manufacture of the mask set chips that have specifications and functions of the signal processing circuit 11 not satisfied by the previously manufactured main chip 10 and functional chips 20A to 20C, and that have functions such as control of the functional chips 20A to 20C and transmission paths for signal transmission between the functional chips 20A to 20C. It should be noted that the circuit within the main chip 10 is configured to be combinable with the circuits within the functional chips 20A to 20C irrespective of the types of functions of the functional chips 20A to 20C.

The main chip 10 and functional chips 20A to 20C are subsequently packaged. As a result, the required functions can be implemented and the semiconductor device completed by controlling the selecting circuits 15 within the main chip 10.

In accordance with the first embodiment, the functional chips 20A to 20C can be used in versatile fashion and it is unnecessary to finely change the specifications and functions thereof in response to customer's demand. As a result, it is possible to mass produce these chips in advance, the functional blocks 20A to 20C can be limited to the minimum necessary, the chip area can be reduced and it is possible to lower the chip manufacturing cost.

Further, since for the functional chips 20A to 20C only single function(s) can be mounted on one and the same chip, processes best suited to these functional chips can be selected. For example, in order to incorporate a DRAM in a main chip in an SoC thus far, a special chip manufacturing process that is a mixture of a process for manufacturing logic circuits and a memory manufacturing process is required. This leads to an increase in the chip manufacturing cost. In accordance with the first embodiment, however, DRAM chips in which the functional chips 20A to 20C have been manufactured by a process exclusively for memory can be used as functional chips, thereby enabling a reduction in the chip manufacturing cost.

Further, the functional chips 20A to 20C and main chip 10 that include an MPU or DSP necessitating high-speed signal processing are manufactured using an advanced process in which microfabrication is possible. Further, circuits that require high power-supply voltage and the functional chips 20A to 20C only of comparatively low-speed operation are manufactured using a process of lower working precision. The chip manufacturing cost is reduced as a result.

Further, the functions of the semiconductor device can be changed merely by interchanging or adding on the stacked functional chips 20A to 20C. Chip re-design for every function change is not necessary, unlike the conventional SoC. This makes possible a major reduction in the manufacturing cost.

In the first embodiment, a case where there are three functional chips 20A to 20C is illustrated. Naturally, however, the number of functional chips need not be three and the number can be changed in conformity with customer's demand. Further, the functions of the functional chips may be the same or different from chip to chip.

Further, in the first embodiment, an example is illustrated in which the chip-to-chip signal transmission means is implemented by non-contact signal transmission utilizing inductive coupling. However, inductive coupling need not necessarily be used as the chip-to-chip signal transmission means. Besides signal transmission means using the inductive coupling, it is also possible to transmit signals by signal transmission means using wire bond between chips, signal transmission means utilizing capacitive coupling, signal transmission means using via holes that form signal transmission paths through the chip, signal transmission means using a micropump, signal transmission means using solder balls, or any combination of these signal transmission means. Naturally, it does not matter if the chips are implemented by being placed side by side rather than being stacked.

Though the present invention has been described in accordance with the foregoing embodiments, the invention is not limited to these embodiments and it goes without saying that the invention covers various modifications and changes that would be obvious to those skilled in the art within the scope of the claims.

What is claimed is:

1. A semiconductor device comprising:
a first semiconductor chip having a first signal processing circuit that executes signal processing, a plurality of first signal transmitting circuits that transmit signals between said first signal processing circuit and an exterior, and a control circuit that controls operation/non-operation of said first signal transmitting circuits in accordance with content of signal processing by said first signal processing circuit; and
a plurality of second semiconductor chips, each having a second signal processing circuit that executes signal processing different from that of said first signal processing circuit, and one or a plurality of second signal transmitting circuits that transmit signals between said second signal processing circuit and said first signal processing circuit, wherein:
said first signal transmitting circuits are arranged in a peripheral region of said first semiconductor chip;
said first semiconductor chip and said plurality of second semiconductor chips are stacked; and
said second signal transmitting circuits of each of said plurality of second semiconductor chips and at least one of the plurality of first signal transmitting circuits are arranged so as to overlap when viewed from a stacking direction.

2. A semiconductor device according to claim 1, wherein said first semiconductor chip has selecting circuits that select operation/non-operation of said first signal transmitting circuits in response to control by said control circuit.

3. A semiconductor device according to claim 2, wherein said first signal processing circuit is connected to each of said selecting circuits via a common signal line group.

4. A semiconductor device according to claim 1, wherein said first signal processing circuit is connected to each of said first signal transmitting circuits via a common signal line group.

5. A semiconductor device according to claim 1, wherein signal transmission paths between said first signal transmitting circuits and said second signal transmitting circuits include any one or a plurality of bonding wires, solder bumps, capacitive coupling and via holes.

6. A semiconductor device according to claim 1, wherein circuits within said first semiconductor chip are configured so as to be combinable with circuits within said second semiconductor chips irrespective of type of function of said second semiconductor chips.

7. A semiconductor device according to claim 1, wherein said first semiconductor chip and said second semiconductor chips are manufactured in advance before function and use of the device are decided.

* * * * *